United States Patent [19]
Kim et al.

[11] Patent Number: 5,989,949
[45] Date of Patent: *Nov. 23, 1999

[54] METHOD OF MANUFACTURING A COMPLEMENTARY METAL-OXIDE SEMICONDUCTOR DEVICE

[75] Inventors: Jae-Kap Kim; Kwang-Soo Kim, both of Kyoungki-do, Rep. of Korea

[73] Assignee: Hyundai Electronics Industries Co., Ltd., Kyoungki-do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/883,202

[22] Filed: Jun. 26, 1997

[30] Foreign Application Priority Data

Jun. 29, 1996 [KP] DPR of Korea .................. 96-26318

[51] Int. Cl.$^6$ .............................................. H01L 21/8238
[52] U.S. Cl. ........................... 438/217; 438/276; 438/289
[58] Field of Search ................................ 438/217, 220, 438/224, 275, 276, 289; 257/392

[56] References Cited

U.S. PATENT DOCUMENTS

| | | | |
|---|---|---|---|
| 4,472,871 | 9/1984 | Green et al. | 438/276 |
| 5,091,324 | 2/1992 | Hsu et al. | 148/DIG. 82 |
| 5,272,367 | 12/1993 | Dennison et al. | 257/306 |
| 5,384,279 | 1/1995 | Stolmeijer et al. | 438/217 |
| 5,403,764 | 4/1995 | Yamamoto et al. | 438/257 |
| 5,407,849 | 4/1995 | Khambaty et al. | 438/217 |

FOREIGN PATENT DOCUMENTS

| | | |
|---|---|---|
| 62-57242 | 3/1987 | Japan . |
| 62-60254 | 3/1987 | Japan . |
| 2-67755 | 3/1990 | Japan . |
| 4-263468 | 9/1992 | Japan . |
| 7-130868 | 5/1995 | Japan . |
| 7-183393 | 7/1995 | Japan . |
| 8-204025 | 8/1996 | Japan . |

OTHER PUBLICATIONS

R. Muller et al, *Device Electronics for Integrated Circuits II*, pp. 505–512.

*Primary Examiner*—Tuan H. Nguyen
*Attorney, Agent, or Firm*—Ware, Fressola, Van Der Sluys & Adolphson LLP

[57] ABSTRACT

Disclosed is a method of manufacturing a complementary metal-oxide semiconductor device. The method includes the steps of: forming a plurality of field oxide layers; forming a screen oxide film on each surface of the first, second, third and fourth active regions; forming a first mask pattern for exposing first and second active regions; forming a N-type well to a selected depth from each surface of the exposed first and second active regions; forming a N-type ion implanted layer right beneath each surface of the first and second active regions; removing the first mask pattern; forming a second mask pattern for exposing the third active region; forming a P-type well to a selected depth from the surface of the exposed third active region; forming a first P-type ion implanted layer right beneath the surface of the third active region; removing the second mask pattern; forming a third mask pattern for exposing first and fourth active regions; forming a second P-type ion implanted layer for controlling a third threshold voltage right beneath each surface of the first and fourth active regions; and forming a gate electrode including a gate oxide film on the first, second, third and fourth active regions.

30 Claims, 6 Drawing Sheets

METHOD OF MANUFACTURING A COMPLEMENTARY METAL-OXIDE SEMICONDUCTOR DEVICE

BACKGROUND OF THE INVENTION

1. Field of the Invention

The present invention relates to a method of manufacturing a complementary metal-oxide semiconductor device, and more particularly to a method of manufacturing a complementary metal-oxide semiconductor(hereinafter simply referred to as "CMOS" device) for a n-channel element and a p-channel element respectively having a low threshold voltage in a semiconductor device, which is convenient to manufacture.

2. Description of the Prior Art

Generally, it is required to provide special performances to an integrated circuit due the high integration and increased complex functionality of semiconductor devices. For this purpose, a CMOS transistor having an improved N-type MOS transistor and an improved P-type MOS transistor has been developed. The improved N-type MOS transistor and P-type MOS transistor have a relatively low threshold voltage in regard to a specific region in the semiconductor device, and are respectively named Low Vt N-type MOS transistor and Low Vt P-type MOS transistor. The Low Vt N-type MOS transistor and the Low Vt P-type MOS transistor minimize voltage drop between a source and a drain in the MOS transistor. Consequently, the characteristic of the semiconductor device employing the CMOS transistor is enhanced.

In order to form the Low Vt N-type MOS transistor and the Low Vt P-type MOS transistor, however, an additional mask forming process and an additional ion implantation process must be applied to a region of the Low Vt N-type MOS transistor and a region of the Low Vt P-type MOS transistor, respectively. Consequently, the yield of the CMOS transistor is decreased, the manufacturing cost of the CMOS transistor is highly increased.

SUMMARY OF THE INVENTION

The present invention is provided to solve the foregoing problems. It is an object of the present invention to provide a method of manufacturing a CMOS device including a Low Vt N-type MOS transistor and a Low Vt P-type MOS transistor by using an ion-implantation process, in which a counter doping technique is employed, for controlling the threshold voltage, without employing an additional mask forming process and an additional ion-implantation process for controlling the threshold voltage during the production of the complementary metal-oxide semiconductor device. Accordingly, the above described CMOS device is convenient to manufacture, has improved yield, and can be manufactured at a low cost.

In order to achieve the above object, the present invention provides a method of manufacturing a CMOS device, including the steps of:

(S1) forming a plurality of field oxide layers for defining first to fourth active regions which are sequentially positioned at predetermined regions of a semiconductor substrate;

(S2) forming a screen oxide film on each surface of the first to fourth active regions;

(S3) forming a first mask pattern for exposing first and second active regions;

(S4) forming a N-type well to a selected depth from each surface of the exposed first and second active regions;

(S5) forming a N-type ion implanted layer for controlling a first threshold voltage right beneath each surface of the first and second active regions;

(S6) removing the first mask pattern;

(S7) forming a second mask pattern for exposing the third active region;

(S8) forming a P-type well to a selected depth from the surface of the exposed third active region;

(S9) forming a first P-type ion implanted layer for controlling a second threshold voltage right beneath the surface of the third active region;

(S10) removing the second mask pattern;

(S11) forming a third mask pattern for exposing first and fourth active regions;

(S12) forming a second P-type ion implanted layer for controlling a third threshold voltage right beneath each surface of the first and fourth active regions; and (S13) forming a gate electrode including a gate oxide film on the first to fourth active regions.

Furthermore, in order to achieve the above object, the present invention provides a method of manufacturing a CMOS device, including the steps of:

(S1) forming a plurality of field oxide layers for defining first to fourth active regions which are sequentially positioned at predetermined regions of a semiconductor substrate;

(S2) forming a screen oxide film on each surface of the first to fourth active regions;

(S3) forming a first mask pattern for exposing first and second active regions;

(S4) forming a N-type well to a selected depth from each surface of the exposed first and second active regions;

(S5) forming a first N-type ion implanted layer for controlling a first threshold voltage right beneath each surface of the first and second active regions;

(S6) removing the first mask pattern;

(S7) forming a second mask pattern for exposing the third and fourth active regions;

(S8) forming a P-type well to a selected depth from each surface of the exposed third and fourth active regions;

(S9) forming a P-type ion implanted layer for controlling a second threshold voltage right beneath the surface of the third and fourth active regions;

(S10) removing the second mask pattern;

(S11) forming a third mask pattern for exposing second and fourth active regions;

(S12) forming a second N-type ion implanted layer for controlling a third threshold voltage right beneath each surface of the second and fourth active regions; and (S13) forming a gate electrode including a gate oxide film on the first to fourth active regions.

In addition, in order to achieve the above object, the present invention provides a method of Manufacturing a complementary metal-oxide semiconductor device, having the steps of:

(S1) forming a plurality of field oxide layers for defining first to fourth active regions which are sequentially positioned at predetermined regions of a semiconductor substrate;

(S2) forming a screen oxide film on each surface of the first to fourth active regions;

(S3) forming a first mask pattern for exposing first and second active regions;

(S4) forming a N-type well to a selected depth from each surface of the exposed first and second active regions;

(S5) forming a N-type ion implanted layer for controlling a first threshold voltage right beneath each surface of the first and second active regions;

(S6) removing the first mask pattern;

(S7) forming a second mask pattern for exposing the third and fourth active regions;

(S8) forming a P-type well to a selected depth from each surface of the exposed third and fourth active regions;

(S9) forming a first P-type ion implanted layer for controlling a second threshold voltage right beneath the surface of the third and fourth active regions;

(S10) removing the second mask pattern;

(S11) forming a third mask pattern for exposing first and third active regions;

(S12) forming a second P-type ion implanted layer for controlling a third threshold voltage right beneath each surface of the first and third active regions; and (S13) forming a gate electrode including a gate oxide film on the first to fourth active regions.

BRIEF DESCRIPTION OF THE DRAWINGS

The above object and other characteristics and advantages of the present invention will become more apparent by describing in detail a preferred embodiment thereof with reference to the attached drawings, wherein.

DETAILED DESCRIPTION OF THE INVENTION

Hereinafter, the preferred embodiment of the present invention will be explained in more detail with reference to the accompanying drawings.

A first embodiment will be described with reference to FIGS. 1A to 1D.

Figure 1A:
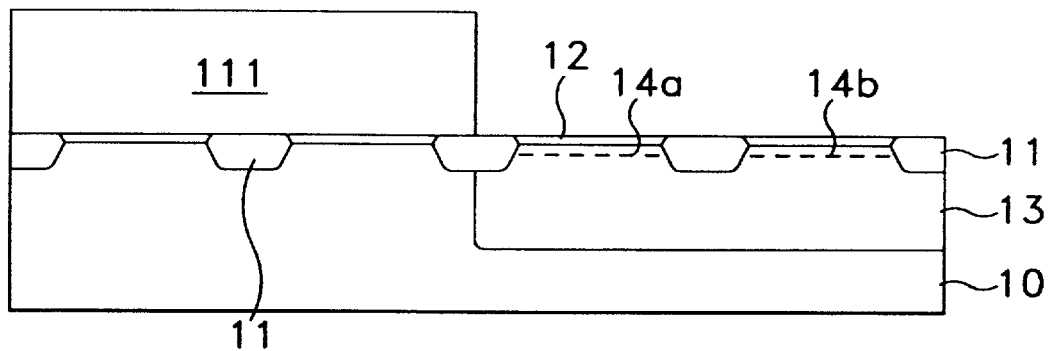
FIGS. 1A to 1D are schematic sectional views showing a manufacturing process of the CMOS device according to a preferred first embodiment of the present invention.

As shown in FIG. 1A, a plurality of field oxide layers 11 are formed at predetermined regions of a P-type semiconductor substrate 10. A first to fourth active regions are defined by the formation of the plurality of field oxides 11, and are named from the right of figures. A screen oxide film 12 is then formed for preventing the P-type semiconductor substrate 10 from being damaged by subsequent manufacturing steps of the CMOS device. Thereafter, an impurity-buried layer (not shown) may be formed in the P-type semiconductor substrate 10 at a predetermined depth.

Next, a N-well mask pattern 111 for forming a N-well is formed on third and fourth active regions at a thickness of about 2 to 4 $\mu$m. At this time, a desired N-well region 13 is exposed. After forming the N-well mask pattern 111, is phosphorus atoms of N-type impurity, are implanted into the P-type semiconductor substrate 10 at an energy of 700 KeV~1.5 MeV and at an ion-implantation concentration of $1\times10^{13}$ to $5\times10^{13}$ ions/cm$^2$. In order to control the threshold voltage of the Normal P-type MOS transistor at the voltage of −0.45~−0.7 V, the phosphorus atoms are then implanted into the P-type semiconductor substrate 10 at an energy of 180 KeV~250 MeV and at an ion-implantation concentration of $5\times10^{12}$ to $5\times10^{13}$ ions/cm$^2$. Thereafter, the phosphorus atoms are also implanted into the P-type semiconductor substrate 10 at an energy of 30 KeV~80 MeV and at an ion-implantation concentration of $2\times10^{12}$ to $8\times10^{12}$ ions/cm$^2$, whereby first impurity layers 14a, 14b are respectively formed at a region of a Normal P-type MOS transistor and a region of a Low Vt P-type MOS transistor having a low threshold voltage.

Figure 1B:
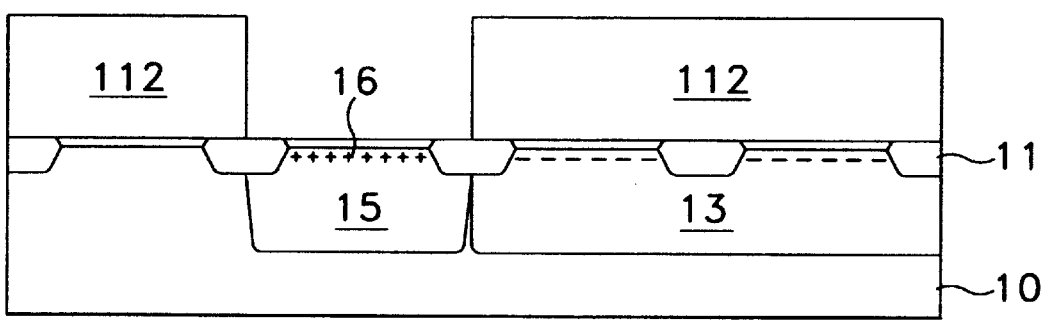

After removing the N-type well mask pattern 111, a P-type well mask pattern 112 for forming a P-well, is formed on the first and second active regions and the fourth active region at the thickness of 2~4 $\mu$m. At this time, a region of the Normal N-type MOS transistor having the threshold voltage of 0.45~0.7 V is left exposed as shown in FIG. 1B. In order to form a P-type well 15, boron atoms are then implanted into the P-type semiconductor substrate 10 at an energy of 500 KeV~700 MeV and at an ion-implantation concentration of $1\times10^{13}$ to $5\times10^{13}$ ions/cm$^2$. After the ion implantation for the formation of P-well, a process for forming a second impurity layer 16 is performed. Boron atoms are first implanted into the surface of the P-type well 15 at an energy of 70~120 KeV and the ion-implantation concentration of $1\times10^{13}$ to $5\times10^{13}$ ions/cm$^2$. The boron atoms are then also implanted into the surface of the P-type well 15 at an energy of 10~50 KeV and at an ion-implantation concentration of $1\times10^{12}$ to $5\times10^{12}$ ions/cm$^2$, whereby a second impurity layer 16 is formed.

Figure 1C:
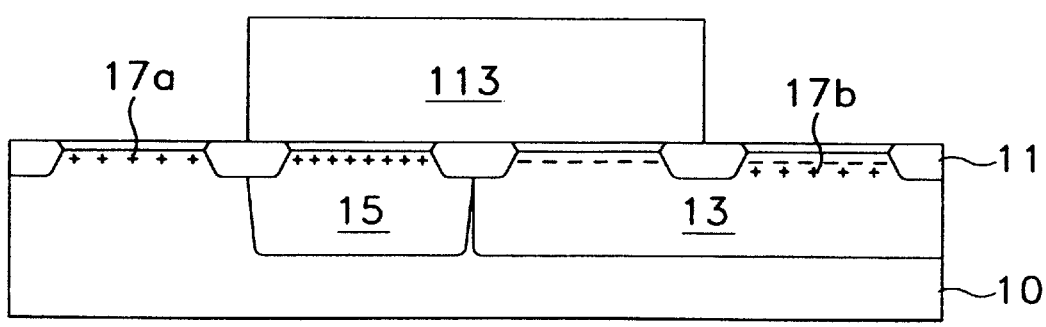
Figure 1D:
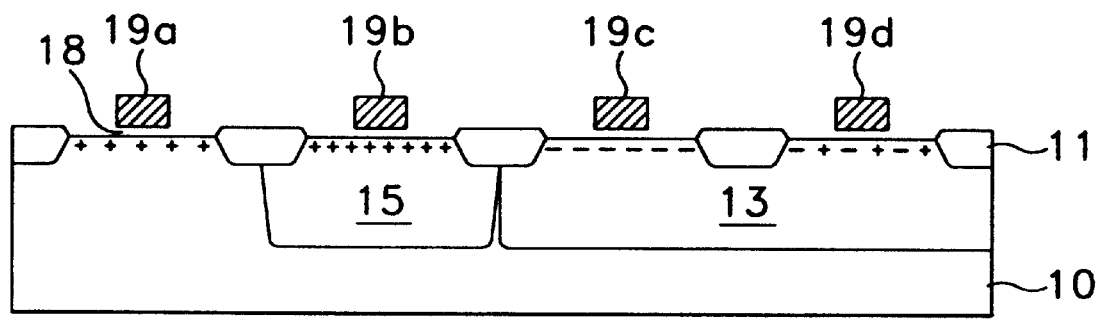

After removing the P-type well mask pattern 112, an impurity mask pattern 113 for forming Low Vt NMOS/PMOS transistors is formed. The impurity mask pattern 113 exposes the fourth active region where the N-type MOS transistor is to be formed and the first active region where the Low Vt P-type MOS transistor is to be formed as shown in FIG. 1C. Further, the Low Vt N-type MOS transistor is formed on the fourth active region of the P-type semiconductor substrate 10 where the well is not formed. Boron atoms are then implanted into the P-type semiconductor substrate 10 at an energy of 10~50 KeV and at an ion-implantation concentration of $1\times10^{12}$ to $5\times10^{12}$ ions/cm$^2$, whereby third impurity layers 17a and 17b are formed. At this time, the threshold voltage of the Low Vt N-type MOS transistor becomes 0.2~0.4 V. Furthermore, the first impurity layer 14b of the first active region where, the Low Vt P-type MOS transistor is to be formed, is counter-doped with the third impurity layer 17b. As a result, the threshold voltage of the P-type MOS transistor becomes −0.2~−0.4 V.

Thereafter, the impurity mask pattern 113 is removed. Afterwards, a gate oxide 18 and gate electrodes 19a~19d are formed. The following process for manufacturing the CMOS device is the same as the manufacturing process of the CMOS device according to the prior art.

As described above, according to the present invention, it is possible to produce a MOS transistor having a low threshold voltage by using the counter doping process without employing an additional masking process or an additional ion-implantation process.

Figure 2:
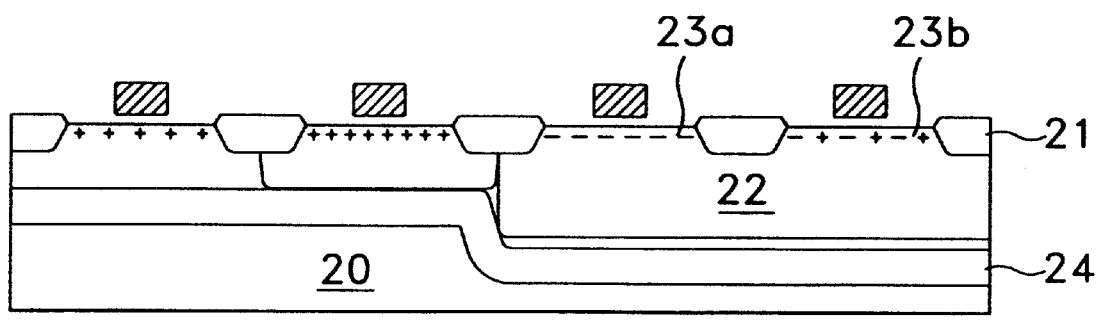
FIG. 2 is a sectional view of a modified CMOS device according to the preferred first embodiment of the present invention, showing an impurity-buried layer formed in a semiconductor substrate.

Referring to FIG. 2, a plurality of field oxide layers 21 and a plurality of screen oxide films 22 are formed on a semiconductor substrate 20. A first to fourth active regions are defined by the formation of the plurality of field oxides 11, and are named from the right of figures. A N-type well 22 and a plurality of first impurity layers 23a, 23b are then formed on the semiconductor substrate 20. Thereafter, boron atoms are implanted into a lower portion of the N-type well 22 at an energy of 1.5~1.8 MeV and the ion-implantation concentration of $1\times10^{13}$ to $5\times10^{13}$ ions/cm$^2$, whereby an impurity-buried layer 24 is formed in the semiconductor substrate 20. The impurity-buried layer 24 is formed to have step difference as shown in this figure due to the N-type well mask pattern. That is, the depth of the impurity-buried layer which is positioned in the lower portion of the N-type well, is greater than the depth of the impurity-buried layer which is positioned in the lower portion of the N-type well mask pattern. The succeeding ion-implantation process and the gate electrode forming process are the same as the manufacturing process of the CMOS device according to conventional methods.

A second embodiment according to the present invention, will be described with reference to FIGS. 3A to 3D.

Figure 3A:
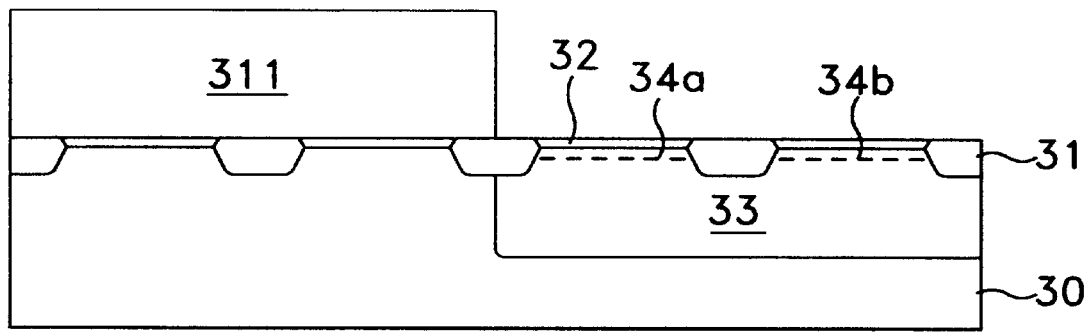
FIGS. 3A to 3D are schematic sectional views of a CMOS device according to a preferred second embodiment of the present invention, showing a manufacturing process of the CMOS device.

As shown in FIG. 3A, a plurality of field oxide layers 31 are formed at predetermined regions of a P-type semiconductor substrate 30. A first to fourth active regions are defined by the formation of the plurality of field oxides 31, and are named from the right of figures. A plurality of screen oxide films 32 are then formed for preventing the P-type semiconductor substrate 30 from being damaged by successive manufacturing steps of the CMOS device. Thereafter, an impurity-buried layer (not shown) can be formed in the P-type semiconductor substrate 30 at a predetermined depth.

Next, a N-type well mask pattern 311 forming a N-well is formed on the first and second active regions at a thickness of about 2 to 4 μm. At this time, a desired N-type well region 33 is exposed. After forming the N-type well mask pattern 311, phosphorus atoms, which are of a N-type impurity, are implanted into the P-type semiconductor substrate 30 at an energy of 700 KeV~1.5 MeV and at an ion-implantation concentration of $1\times10^{13}$ to $5\times10^{13}$ ions/cm$^2$. Thereby, a N-type well 33 is formed. In order to control the threshold voltage of the P-type MOS transistor at the voltage of −0.1~−0.45 V, the phosphorus atoms are then implanted into the P-type semiconductor substrate 30 at an energy of 180 KeV~250 MeV and at an ion-implantation concentration of $5\times10^{12}$ to $2\times10^{13}$ ions/cm$^2$. Thereafter, the phosphorus atoms are also implanted into the P-type semiconductor substrate 30 at an energy of 30~80 KeV and at an ion-implantation concentration of $5\times10^{11}$ to $5\times10^{12}$ ions/cm$^2$. Thereby, first impurity layers 34a, 34b are respectively formed at a region of a Normal P-type MOS transistor and a region of a Low Vt P-type MOS transistor.

Figure 3B:
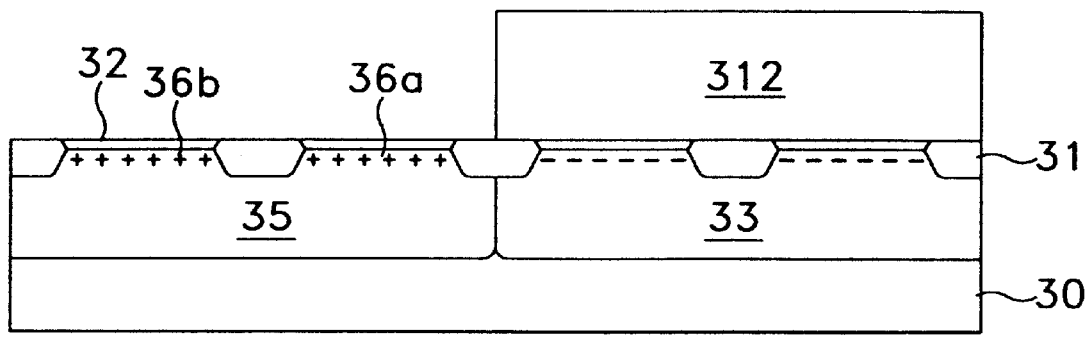

After removing the N-type well mask pattern 311, P-type well mask pattern 312 is formed on the total structure at the thickness of 2~4 μm as shown in FIG. 3B. In order to form a P-type well 35, boron atoms are then implanted into the P-type semiconductor substrate 10 at an energy of 500~700 KeV and at an ion-implantation concentration of $1\times10^{13}$ to $5\times10^{13}$ ions/cm$^2$. After the ion implantation for the formation of P-well, a process for forming impurity layers 36a and 36b is performed. Boron atoms are implanted into the surface of the P-type well 35 at an energy of 70~120 KeV and at an ion-implantation concentration of $5\times10^{12}$ to $2\times10^{13}$ ions/cm$^2$. The boron ions are also implanted into the surface of the P-type well 35 at an energy of 10~30 KeV and at an ion-implantation concentration of $1\times10^{12}$ to $5\times10^{12}$ ions/cm$^2$, whereby second impurity layers 36a and 36b are formed. As a result, the threshold voltage of the Normal N-type MOS transistor becomes 0.45~0.7 V.

Figure 3C:
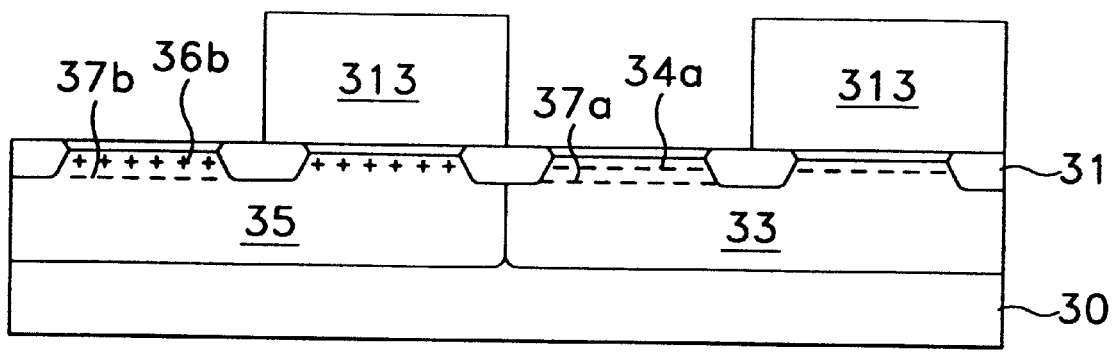

After removing the P-type well mask pattern 312, an impurity mask pattern 313 for forming Low Vt NMOS/PMOS transistors, is formed. The impurity mask pattern 313 exposes a region of the Low Vt N-type MOS transistor and a region of the Normal P-type MOS transistor, as shown in FIG. 3C. Furthermore, the Low Vt N-type MOS transistor is formed on the P-type well. Phosphorus atoms are then implanted into the P-type semiconductor substrate 30 at an energy of 30~80 KeV and at an ion-implantation concentration of $1\times10^2$ to $8\times10^{12}$ ions/cm$^2$, whereby third impurity layers 37a and 37b are formed. At this time, the threshold voltage of the Normal P-type MOS transistor becomes −0.45~−0.7 V as the result of accumulation with the threshold voltage of the first impurity layer 34a. Moreover, the Low Vt N-type MOS transistor is counter-doped with the second impurity layer 36b. As a result, the threshold voltage of the Low Vt N-type MOS transistor becomes 0.1~0.4 V.

Figure 3D:
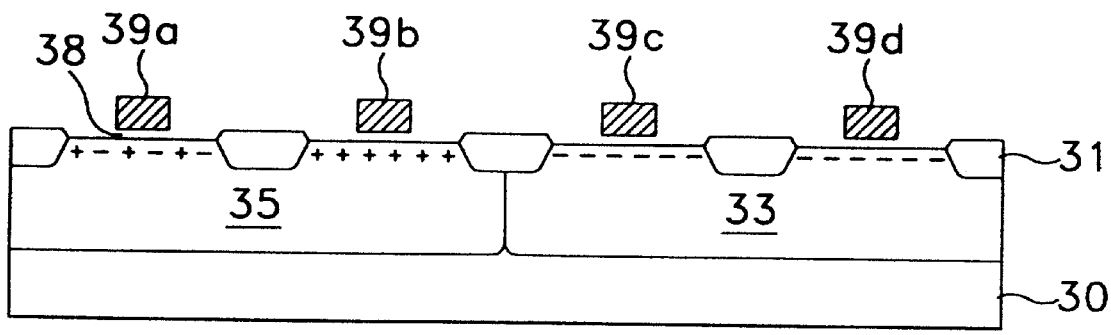

Thereafter, the impurity mask pattern 313 is removed. Then, oxide films 38 and gate electrodes 39a~39d are formed, as shown in FIG. 3D. The succeeding process for Manufacturing the CMOS device is the same as the manufacturing process of the CMOS device according to conventional methods. In the same manner as the first embodiment according to the present invention, boron ions can be implanted into the P-type semiconductor substrate 30 at an energy of 1.5~2.5 MeV and at an ion-implantation concentration of $1\times10^{13}$ to $5\times10^{13}$ ions/cm$^2$, whereby an impurity-buried layer is formed.

A third embodiment according to the present invention will be described with reference to FIGS. 4A to 4D.

Figure 4A:
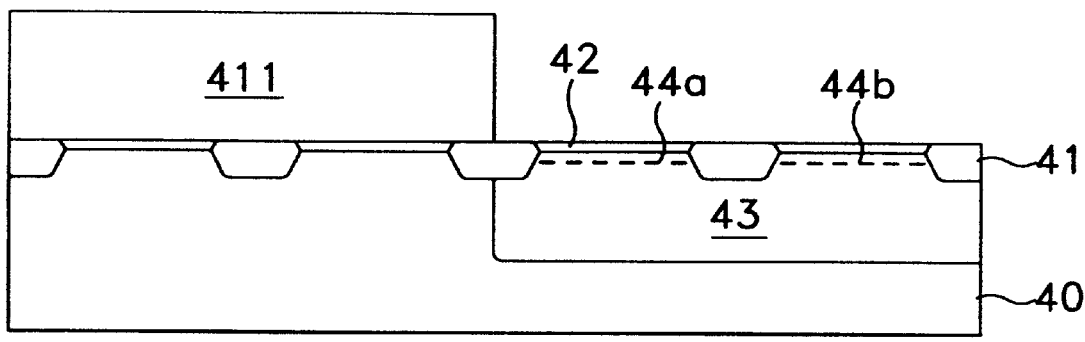
FIGS. 4A to 4D are schematic sectional views of a CMOS device according to a preferred third embodiment of the present invention, showing a manufacturing process of the CMOS device.

As shown in FIG. 4A, a field oxide layer 41 is formed at predetermined regions of a P-type semiconductor substrate 40. A first to fourth active regions are defined by the formation of the plurality of field oxides 41, and are named from the right of figures. A screen oxide film 42 is formed for preventing the P-type semiconductor substrate 40 from being damaged by successive manufacturing steps of the CMOS device. Thereafter, a N-type well mask pattern 411 for exposing first and second active regions, is formed at a thickness of about 2 to 4 μm. At this time, a desired N-type well region is exposed. After forming the N-type well mask pattern 411, a phosphorus ion, which is a N-type impurity, is implanted into the P-type semiconductor substrate 40 at the energy of 700 KeV~1.5 MeV and the ion-implantation concentration of $1\times10^{13}$ to $5\times10^{13}$ ions/cm$^2$. Thus, a N-type well 43 is formed. After forming the screen oxide film 42, an impurity-buried layer can be formed in a semiconductor substrate at a predetermined depth in the same manner as the second embodiment according to the present invention.

In order to control the threshold voltage of the Normal P-type MOS transistor at the voltage of −0.7~−0.45 V, the phosphorus atoms are implanted into the P-type semiconductor substrate 40 at an energy of 180 KeV~250 MeV and at an ion-implantation concentration of $5\times10^{12}$ to $2\times10^{13}$ ions/cm$^2$. Thereafter, the phosphorus atoms are also implanted into the P-type semiconductor substrate 40 at an energy of 30~80 KeV and at an ion-implantation concentration of $2\times10^{12}$ to $8\times10^{12}$ ions/cm$^2$. Thus, first impurity layers 44a, 44b are formed at a region of a Normal P-type MOS transistor and a region of a Low Vt P-type MOS transistor.

Figure 4B:
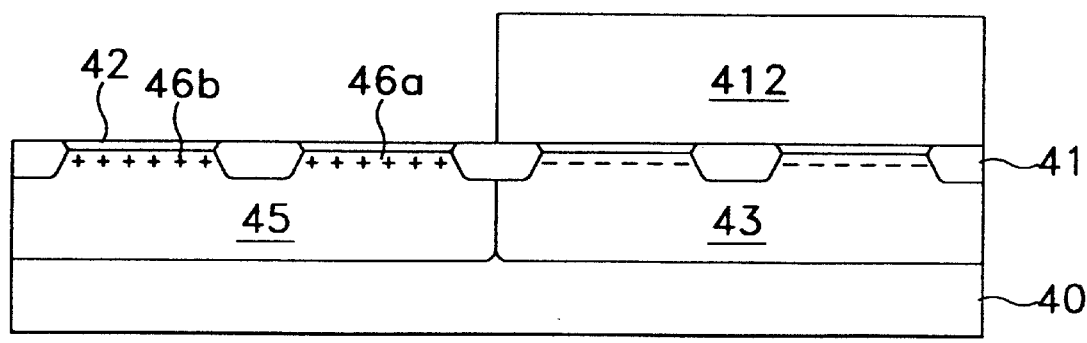

After removing the N-type well mask pattern 411, a P-type well mask pattern 412 for forming a P-well 45, is formed on first and second active regions the thickness of 2~4 μm as shown in FIG. 4B. Then, boron atoms are implanted into the P-type semiconductor substrate 40 at an energy of 500 KeV~700 MeV and at an ion-implantation concentration of $1\times10^{13}$ to $5\times10^{13}$ ions/cm². Thereafter, boron atoms are implanted into the surface of the P-type well 45 at an energy of 70~120 KeV and at an ion-implantation concentration of $5\times10^{12}$ to $2\times10^{13}$ ions/cm². The boron atoms are then also implanted into the surface of the P-type well 45 at an energy of 10~30 KeV and at an ion-implantation concentration of $2\times10^{11}$ to $3\times10^{12}$ ions/cm², whereby a plurality of second impurity layers 46a and 46b are formed. As a result, the threshold voltage of the Low Vt N-type MOS transistor becomes 0.1~0.4 V.

Figure 4C:
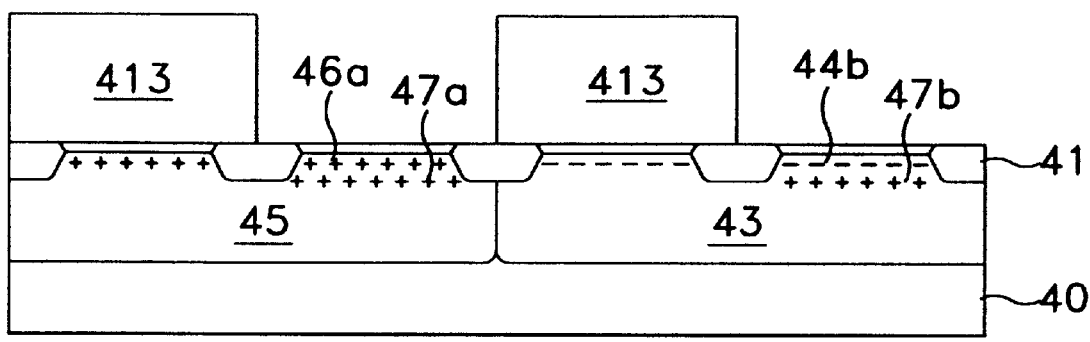

After removing the P-type well mask pattern 412, an impurity mask pattern 413 is formed such that a region of Low Vt P-type MOS transistor and a region of Normal N-type MOS transistor are respectively exposed as shown in FIG. 4C. Boron atoms are then implanted into the P-type semiconductor substrate 40 at an energy of 10~30 KeV and at an ion-implantation concentration of $1\times10^{12}$ to $5\times10^{12}$ ions/cm², whereby third impurity layers 47a and 47b are formed. As a result, the threshold voltage of the normal N-type MOS transistor becomes 0.45~0.7 V, since the third impurity layer 47a is added to the second impurity layer 46a. Furthermore, the P-type MOS transistor having a low threshold voltage is counter-doped with the first impurity layer 46b. As a result, the threshold voltage of the P-type MOS transistor becomes −0.1~−0.4 V.

Figure 4D:
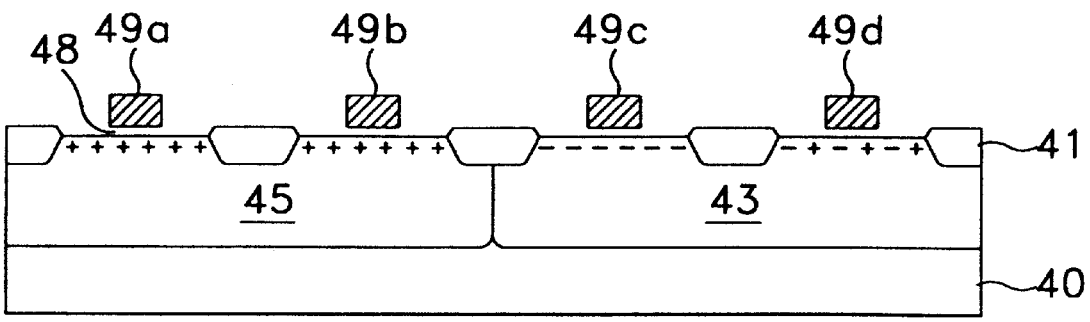

Thereafter, the impurity mask pattern 413 is removed. A gate oxide 48 and gate electrodes 49a–49d are then formed, as shown in FIG. 4D. The succeeding process for manufacturing the CMOS device is the same as the manufacturing process of the CMOS device according to conventional methods. In the same manner as the second embodiment according to the present invention, an impurity-buried layer can be formed.

As described above, according to the present invention, it is possible to produce a CMOS device including the N-type MOS transistor having a low threshold voltage and the P-type MOS transistor by using one ion-implantation process. Therefore, it is unnecessary to perform an additional mask forming process and an additional ion-implantation processes for controlling the threshold voltage during the production of the CMOS transistor. Consequently, the yield of the CMOS transistor is increased, and the manufacturing cost of the CMOS transistor is reduced.

While the present invention has been particularly shown and described with reference to a particular embodiment thereof, it will be understood by those skilled in the art that various changes in form and detail may be effected therein without departing from the spirit and scope of the invention as defined by the appended claims.

What is claimed is:

1. A method of manufacturing a complementary metal-oxide semiconductor device, comprising the steps of:
   (S1) forming a plurality of field oxide layers for defining first, second, third and fourth active regions which are sequentially positioned at predetermined regions of a semiconductor substrate;
   (S2) forming a screen oxide film on each surface of the first, second, third, and fourth active regions;
   (S3) forming a first mask pattern for exposing first and second active regions;
   (S4) forming a N-type well to a selected depth from each surface of the exposed first and second active regions;
   (S5) forming a N-type ion implanted layer for controlling a first threshold voltage right beneath each surface of the first and second active regions;
   (S6) removing the first mask pattern;
   (S7) forming a second mask pattern for exposing the third active region;
   (S8) forming a P-type well to a selected depth from the surface of the exposed third active region;
   (S9) forming a first P-type ion implanted layer for controlling a second threshold voltage right beneath the surface of the third active region;
   (S10) removing the second mask pattern;
   (S11) forming a third mask pattern for exposing the first and fourth active regions;
   (S12) forming a second P-type ion implanted layer for controlling a third threshold voltage right beneath each surface of the first and fourth active regions; and
   (S13) forming a gate electrode including a gate oxide film on the first, second, third, and fourth active regions.

2. The method as claimed in claim 1, further comprising the step of forming an impurity-buried layer at a predetermined depth of said semiconductor substrate by using the ion-implantation process, following the screen oxide film forming step (S2).

3. The method as claimed in claim 1, further comprising the step of forming an impurity-buried layer at a predetermined depth of said semiconductor substrate by using the ion-implantation process, following the step (S5) of forming a N-type ion implanted layer for controlling a first threshold voltage.

4. The method as claimed in claim 3, wherein said impurity-buried layer is formed by implanting boron atoms into said semiconductor substrate at an energy of 1.5~1.8 MeV and at an ion-implantation concentration of $1\times10^{13}$ to $5\times10^{13}$ ions/cm².

5. The method as claimed in claim 1, wherein said first mask pattern has a thickness of 2 to 4 µm.

6. The method as claimed in claim 1, wherein said N-type well is formed by implanting phosphorus atoms into said semiconductor substrate at an energy of 700 KeV to 1.5 MeV and at an ion-implantation concentration of $1\times10^{13}$ to $5\times10^{13}$ ions/cm².

7. The method as claimed in claim 1, wherein the step (S5) forming a N-type ion implanted layer for controlling a first threshold voltage comprises the steps of:
   implanting phosphorus atoms into the surface of said semiconductor substrate at an energy of 180 to 250 KeV and at an ion-implantation concentration of $5\times10^{12}$ to $5\times10^{13}$ ions/cm²; and
   implanting phosphorus atoms into the surface of said semiconductor substrate in at an energy of 30 to 80 KeV and at an ion-implantation concentration of $2\times10^{12}$ to $8\times10^{12}$ ions/cm².

8. The method as claimed in claim 1, wherein said P-type well is formed by implanting boron atoms into said semiconductor substrate at an energy of 500 to 700 KeV and at an ion-implantation concentration of $1\times10^{13}$ to $5\times10^{13}$ ions/cm².

9. The method as claimed in claim 1, wherein the step (S9) of forming a first P-type ion implanted layer for controlling a second threshold voltage comprises the steps of:
   implanting boron atoms into the surface of said semiconductor substrate at an energy of 70 to 120 KeV and at an ion-implantation concentration of $5\times10^{12}$ to $2\times10^{13}$ ions/cm²; and
   implanting boron atoms into the surface of said semiconductor substrate at an energy of 10 to 30 KeV and at an ion-implantation concentration of $1\times10^{12}$ to $5\times10^{12}$ ions/cm².

10. The method as claimed in claim 1, wherein the step (S12) forming a second P-type ion implanted layer for controlling a third threshold voltage comprises the step of implanting boron atoms at an energy of 10 to 50 KeV and at an ion-implantation concentration of $1\times10^{12}$ to $5\times10^{12}$ ions/cm$^2$.

11. A method of manufacturing a complementary metal-oxide semiconductor device, comprising the steps of:

(S1) forming a plurality of field oxide layers for defining first to fourth active regions which are sequentially positioned at predetermined regions of a semiconductor substrate;

(S2) forming a screen oxide film on each surface of the first, second, third and fourth active regions;

(S3) forming a first mask pattern for exposing first and second active regions;

(S4) forming a N-type well to a selected depth from each surface of the exposed first and second active regions;

(S5) forming a first N-type ion implanted layer for controlling a first threshold voltage right beneath each surface of the first and second active regions;

(S6) removing the first mask pattern;

(S7) forming a second mask pattern for exposing the third and fourth active regions;

(S8) forming a P-type well to a selected depth from each surface of the exposed third and fourth active regions;

(S9) forming a P-type ion implanted layer for controlling a second threshold voltage right beneath the surface of the third and fourth active regions;

(S10) removing the second mask pattern;

(S11) forming a third mask pattern for exposing second and fourth active regions;

(S12) forming a second N-type ion implanted layer for controlling a third threshold voltage right beneath each surface of the second and fourth active regions; and (S13) forming a gate electrode including a gate oxide film on the first, second, third and fourth active regions.

12. The method as claimed in claim 11, further comprising the step of forming an impurity-buried layer at a predetermined depth of said semiconductor substrate by using the ion-implantation process, following the screen oxide forming step (S2).

13. The method as claimed in claim 11, further comprising the step of forming an impurity-buried layer at a predetermined depth of said semiconductor substrate by using the ion-implantation process, following the step (S5) of forming a N-type ion implanted layer for controlling a first threshold voltage.

14. The method as claimed in claim 13, wherein said impurity-buried layer is formed by implanting boron atoms into said semiconductor substrate at an energy of 1.5~2.5 MeV and at an ion-implantation concentration of $1\times10^{13}$ to $5\times10^{13}$ ions/cm$^2$.

15. The method as claimed in claim 11, wherein said first mask pattern has a thickness of 2 to 4 $\mu$m.

16. The method as claimed in claim 11, wherein said N-type well is formed by implanting phosphorus atoms into said semiconductor substrate in at an energy of 700 KeV to 1.5 MeV and at an ion-implantation concentration of $1\times10^{13}$ to $5\times10^{13}$ ions/cm$^2$.

17. The method as claimed in claim 11, wherein the step (S5) forming a N-type ion implanted layer for controlling a first threshold voltage comprises the steps of:

implanting phosphorus atoms into the surface of said semiconductor substrate at an energy of 180 to 250 KeV and at an ion-implantation concentration of $5\times10^{12}$ to $2\times10^{13}$ ions/cm$^2$; and implanting phosphorus atoms into the surface of said semiconductor substrate at an energy of 30 to 80 KeV and at an ion-implantation concentration of $5\times10^{11}$ to $5\times10^{12}$ ions/cm$^2$.

18. The method as claimed in claim 11, wherein said P-type well is formed by implanting boron atoms into said ---semiconductor substrate at an energy of 500 to 700 KeV and the ion-implantation concentration of $1\times10^{13}$ to $5\times10^{13}$ ions/cm$^2$.

19. The method as claimed in claim 11, wherein the step (S9) of forming a first P-type ion implanted layer for controlling a second threshold voltage comprises the steps of:

implanting boron atoms into the surface of said semiconductor substrate at an energy of 70 to 120 KeV and at an ion-implantation concentration of $5\times10^{12}$ to $2\times10^{13}$ ions/cm$^2$; and implanting boron atoms into the surface of said semiconductor substrate at an energy of 10 to 30 KeV and at an ion-implantation concentration of $1\times10^{12}$ to $5\times10^{12}$ ions/cm$^2$.

20. The method as claimed in claim 11, wherein the step (S12) forming a second P-type ion implanted layer for controlling a third threshold voltage comprises the step of implanting boron atoms at an energy of 30 to 80 KeV and at an ion-implantation concentration of $1\times10^{12}$ to $8\times10^{12}$ ions/cm$^2$.

21. The method of Manufacturing a complementary metal-oxide semiconductor device, comprising the steps of:

(S1) forming a plurality of field oxide layers for defining first, second, third, and fourth active regions which are sequentially positioned at predetermined regions of a semiconductor substrate;

(S2) forming a screen oxide film on each surface of the first to fourth active regions;

(S3) forming a first mask pattern for exposing first and second active regions;

(S4) forming a N-type well to a selected depth from each surface of the exposed first and second active regions;

(S5) forming a N-type ion implanted layer for controlling a first threshold voltage right beneath each surface of the first and second active regions;

(S6) removing the first mask pattern;

(S7) forming a second mask pattern for exposing the third and fourth active regions;

(S8) forming a P-type well to a selected depth from each surface of the exposed third and fourth active regions;

(S9) forming a first P-type ion implanted layer for controlling a second threshold voltage right beneath the surface of the third and fourth active regions;

(S10) removing the second mask pattern;

(S11) forming a third mask pattern for exposing first and third active regions;

(S12) forming a second P-type ion implanted layer for controlling a third threshold voltage right beneath each surface of the first and third active regions; and (S13) forming a gate electrode including a gate oxide film on the first, second, third and fourth active regions.

22. The method as claimed in claim 21, further comprising the step of forming an impurity-buried layer on said semiconductor substrate by using the ion-implantation process, following the screen oxide forming step (S2).

23. The method as claimed in claim 21, further comprising the step of forming an impurity-buried layer at a predetermined depth of said semiconductor substrate by using the ion-implantation process, following the step (S5) of forming a N-type ion implanted layer for controlling a first threshold voltage.

24. The method as claimed in claim 23, wherein said impurity-buried layer is formed by implanting boron atoms into said semiconductor substrate at an energy of 1.5~2.5 MeV and at an ion-implantation concentration of $1 \times 10^{13}$ to $5 \times 10^{13}$ ions/cm$^2$.

25. The method as claimed in claim 21, wherein said first mask pattern has a thickness of 2 to 4 $\mu$m.

26. The method as claimed in claim 21, wherein said N-type well is formed by implanting phosphorus atoms into said semiconductor substrate at an energy of 700 KeV to 1.5 MeV and at an ion-implantation concentration of $1 \times 10^{13}$ to $5 \times 10^{13}$ ions/cm$^2$.

27. The method as claimed in claim 21, wherein the step (S5) forming a N-type ion implanted layer for controlling a first threshold voltage comprises the steps of:

implanting phosphorus atoms into the surface of said semiconductor substrate at an energy of 180 to 250 KeV and at an ion-implantation concentration of $5 \times 10^{12}$ to $2 \times 10^{13}$ ions/cm$^2$; and implanting phosphorus atoms into the surface of said semiconductor substrate in at an energy of 30 to 80 KeV and at an ion-implantation concentration of $2 \times 10^{12}$ to $8 \times 10^{12}$ ions/cm$^2$.

28. The method as claimed in claim 21, wherein said P-type well is formed by implanting boron atoms into said semiconductor substrate in the step (S8) of forming a P-type well at an energy of 500 to 700 KeV and an ion-implantation concentration of $1 \times 10^{13}$ to $5 \times 10^{13}$ ions/cm$^2$.

29. The method as claimed in claim 21, wherein the step (S9) of forming a first P-type ion implanted layer for controlling a second threshold voltage comprises the steps of:

implanting boron atoms into the surface of said semiconductor substrate at an energy of 70 to 120 KeV and at an ion-implantation concentration of $5 \times 10^{12}$ to $2 \times 10^{13}$ ions/cm$^2$; and implanting boron atoms into the surface of said semiconductor substrate at an energy of 10 to 30 KeV and at an ion-implantation concentration of $2 \times 10^{11}$ to $3 \times 10^{12}$ ions/cm$^2$.

30. The method as claimed in claim 21, wherein the step (S12) forming a second P-type ion implanted layer for controlling a third threshold voltage comprises the step of implanting boron atoms at an energy of 10 to 30 KeV and at an ion-implantation concentration of $1 \times 10^{12}$ to $5 \times 10^{12}$ ions/cm$^2$.

\* \* \* \* \*

UNITED STATES PATENT AND TRADEMARK OFFICE
CERTIFICATE OF CORRECTION

PATENT NO : 5,989,949
DATED : November 23, 1999
INVENTOR(S): Jae-Kap Kim, Kwang-Soo Kim It is certified that error appears in the above-identified patent and that said Letters Patent are hereby corrected as shown below:

On the title page:

At INID [30], after "Foreign Application Priority Data" insert: --Jun. 29, 1996 [KP] DPR of Korea ............ 96-26294--.

At column 4, line 1, delete "is".

At column 4, line 52, after "where", delete ",".

At column 6, line 10, delete "1x10$^2$" and substitute --1x10$^{12}$--.

At column 10, line 9, (claim 18, line 3), delete "~~".

Signed and Sealed this

Twenty-fourth Day of April, 2001

Attest:

NICHOLAS P. GODICI

Attesting Officer    Acting Director of the United States Patent and Trademark Office